United States Patent
Xu et al.

(10) Patent No.: US 9,443,889 B2
(45) Date of Patent: Sep. 13, 2016

(54) METHOD FOR MANUFACTURING ARRAY SUBSTRATE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Dalin Xu, Beijing (CN); JaeYun Jung, Beijing (CN); Shikai Wang, Beijing (CN); Keunbum Lee, Beijing (CN); Fugang Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/802,623

(22) Filed: Jul. 17, 2015

(65) Prior Publication Data
US 2016/0118421 A1 Apr. 28, 2016

(30) Foreign Application Priority Data

Oct. 28, 2014 (CN) .......................... 2014 1 0591712

(51) Int. Cl.
*H01L 21/768* (2006.01)
*H01L 27/12* (2006.01)
*H01L 29/40* (2006.01)

(52) U.S. Cl.
CPC ......... *H01L 27/1288* (2013.01); *H01L 21/768* (2013.01); *H01L 27/124* (2013.01); *H01L 29/401* (2013.01)

(58) Field of Classification Search
CPC . H01L 27/1288; H01L 27/124; H01L 29/40; H01L 21/768
See application file for complete search history.

(56) References Cited

U.S. PATENT DOCUMENTS

| | | | | |
|---|---|---|---|---|
| 7,649,586 B2* | 1/2010 | Kim | ................ | G02F 1/136204 324/760.01 |
| 8,624,243 B2* | 1/2014 | Koo | ................ | G02F 1/1309 257/48 |
| 2003/0197814 A1* | 10/2003 | Choi | ................ | G02F 1/136204 349/40 |
| 2006/0033857 A1* | 2/2006 | Kim | ................ | G02F 1/136204 349/54 |
| 2006/0145155 A1* | 7/2006 | Choi | ................ | H01L 27/12 257/59 |
| 2006/0177770 A1* | 8/2006 | Kim | ................ | H01L 21/84 430/296 |
| 2007/0090410 A1* | 4/2007 | Chen | ................ | H01L 27/0251 257/223 |
| 2011/0095290 A1* | 4/2011 | Koo | ................ | G02F 1/1309 257/48 |
| 2012/0169346 A1* | 7/2012 | Huang | ................ | G02F 1/1309 324/414 |
| 2012/0326148 A1* | 12/2012 | Ko | ................ | H01L 22/14 257/49 |
| 2013/0265069 A1* | 10/2013 | Deng | ................ | G09G 3/006 324/750.3 |
| 2014/0104251 A1* | 4/2014 | Zhang | ................ | G09G 3/3611 345/205 |
| 2014/0375344 A1* | 12/2014 | Wang | ................ | G09G 3/006 324/750.3 |
| 2015/0146122 A1* | 5/2015 | Xu | ................ | G02F 1/136259 349/42 |
| 2016/0041412 A1* | 2/2016 | Lv | ................ | G02F 1/1309 324/760.02 |

* cited by examiner

*Primary Examiner* — Savitr Mulpuri
(74) *Attorney, Agent, or Firm* — Nath, Goldberg & Meyer; Joshua B. Goldberg; Christopher Thomas

(57) ABSTRACT

The present invention provides a method for manufacturing an array substrate, wherein each data line in a plurality of data line groups forms an integral structure with a first shorting bar, and after etching a source-drain component to form a source electrode and a drain electrode, the data line groups which do not correspond to the first shorting bar is disconnected from the first shorting bar. By adopting the method provided by the present invention, electrostatic breakdown in the manufacturing process of the array substrate can be reduced.

20 Claims, 4 Drawing Sheets

METHOD FOR MANUFACTURING ARRAY SUBSTRATE

FIELD OF THE INVENTION

The present invention relates to the field of display technology, and particularly relates to a method for manufacturing an array substrate.

BACKGROUND OF THE INVENTION

In a manufacturing process of an array substrate of a thin film transistor display, due to the reasons of signal input, detection precision and cost control, data lines are usually divided into different groups, each group of data lines corresponds to different shorting bars, and each shorting bar is used for transmitting a signal to the corresponding data line group so as to detect each data line. When the data lines are divided into an odd number data line group and an even number data line group, as shown in FIG. 1, the odd number data line group 1 can be directly connected with a first shorting bar L1, and the even number data line group 2 can be connected with a second shorting bar L2 through a via and a connecting piece 3. Wherein the first shorting bar L1 is arranged on the same layer as the data lines, and the second shorting bar L2 is arranged on the same layer as a gate line.

In a process of manufacturing the array substrate by use of a 4-Mask process, for example, during carrying out a channel ashing process, if too many charges are generated on a certain data line in the odd number data line group 1, the overmany charges could be dispersed to other data lines through the first shorting bar L1. At this time, a via and a connecting piece 3 have not been formed between the even number data line group 2 and the second shorting bar L2, thus the data lines in the even number data line group 2 are still separated from each other. If too many charges are accumulated on a certain even number data line, electrostatic breakdown is liable to occur since the overmany charges could not be dispersed, which may cause degradation of the product quality.

SUMMARY OF THE INVENTION

The present invention aims at providing a method for manufacturing an array substrate, in order to reduce the electrostatic breakdown phenomenon generated in the manufacturing process of the array substrate and improve the quality of the array substrate.

To fulfill the above purpose, the present invention provides a method for manufacturing an array substrate. The array substrate includes a plurality of data line groups and a plurality of shorting bars each correspondingly connected with one of the plurality of data line groups. The method for manufacturing the array substrate includes:
  forming a pattern including a source-drain component, the plurality of data line groups and a first shorting bar, wherein each data line in the plurality of data line groups forms an integral structure with the first shorting bar;
  etching the source-drain component to form a source electrode and a drain electrode;
  disconnecting the data line groups which do not correspond to the first shorting bar from the first shorting bar;
  forming other shorting bars among the plurality of shorting bars other than the first shorting bar; and
  connecting the data line groups which do not correspond to the first shorting bar with the other shorting bars corresponding thereto respectively through connecting pieces,
wherein the step of disconnecting the data line groups which do not correspond to the first shorting bar from the first shorting bar is not prior to the step of etching the source-drain component.

Preferably, the step of forming the other shorting bars among the plurality of shorting bars other than the first shorting bar and the step of forming the pattern including the source-drain component, the plurality of data line groups and the first shorting bar are carried out at the same time.

Preferably, the other shorting bars among the plurality of shorting bars other than the first shorting bar are located at positions farther away from a display area of the array substrate than the position of the first shorting bar.

Preferably, the method further includes: forming a pattern including a gate electrode and a gate line, wherein the step of forming the pattern including the gate electrode and the gate line and the step of forming the other shorting bars among the plurality of shorting bars other than the first shorting bar are carried out at the same time.

Preferably, the step of connecting the data line groups which do not correspond to the first shorting bar with the other shorting bars corresponding thereto respectively through the connecting pieces includes:
  forming a passivation layer;
  forming multiple groups of vias on the passivation layer, wherein each group of vias includes a first via and a second via, the first via is used for exposing one of the data lines in the data line groups which do not correspond to the first shorting bar, and the second via is used for exposing the other shorting bar corresponding to the data line exposed by the first via of the same group; and
  forming a pattern including a plurality of connecting pieces on the passivation layer, wherein each connecting piece is used for connecting the data line in the data line groups which do not correspond to the first shorting bar with the respective corresponding shorting bar through a group of vias.

Preferably, the method further includes: forming a transparent electrode, wherein the step of forming the pattern including the plurality of connecting pieces on the passivation layer and the step of forming the transparent electrode are carried out at the same time.

Preferably, the step of etching the source-drain component and the step of disconnecting the data line groups which do not correspond to the first shorting bar from the first shorting bar are carried out at the same time.

Preferably, the step of forming the pattern including the source-drain component, the plurality of data line groups and the first shorting bar includes:
  forming a data line metal layer;
  forming a photoresist layer on the data line metal layer;
  exposing and developing the photoresist layer by using a halftone mask plate to form an intermediate pattern on the photoresist layer, wherein the intermediate pattern includes full-exposed photoresist, semi-exposed photoresist and unexposed photoresist, which respectively correspond to a transparent region, a semitransparent region and a non-transparent region of the halftone mask plate, the transparent region corresponds to the data line groups, the source-drain component and the first shorting bar, the semitransparent region corresponds to disconnection areas of the data line groups which do not correspond to the first shorting bar, and the non-transparent region corresponds to a part to be etched off on the data line metal layer; and etching the data line metal layer with the intermediate pattern as a mask to form the pattern including the source-drain component, the plurality of data line groups and the first shorting bar, wherein, the steps of etching the source-drain component and disconnecting the data line groups which do not correspond to the first shorting bar from the first shorting bar, which are carried out at the same time, further include:

ashing the intermediate pattern to remove the semi-exposed photoresist; and re-etching the data line metal layer with the ashed intermediate pattern as a mask to form the source electrode and the drain electrode, and disconnecting the data line groups which do not correspond to the first shorting bar from the first shorting bar.

In the present invention, before forming the source electrode and the drain electrode, each data line in the plurality of data line groups forms the integral structure with the first shorting bar, therefore when too many static charges are accumulated on a certain data line, charges are released onto the other data lines through the first shorting bar so as to reduce the electrostatic breakdown phenomenon. At the time of or after forming the source electrode and the drain electrode, data lines in some of data line groups are disconnected from the first shorting bar, and the disconnected data lines are connected with the corresponding shorting bars through the connecting pieces. Therefore, by adopting the method provided by the present invention, before forming the source electrode and the drain electrode, data lines in the data line groups are always intercommunicated with each other, thus electrostatic charges generated in the technological process of forming the source electrode and the drain electrode can be transferred among a plurality of data lines, so as to reduce the electrostatic breakdown phenomenon and improve the product quality.

BRIEF DESCRIPTION OF THE DRAWINGS

The accompanying drawings are used for providing further understanding of the present invention, constitute a part of the description and are used for explaining the present invention together with the following specific embodiments, but do not constitute limitation to the present invention. In the accompanying drawings.

Figure 1:
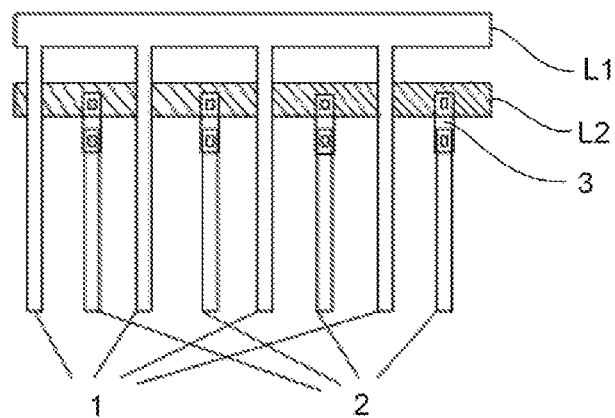
FIG. 1 is a schematic diagram of structures of data lines and shorting bars on an array substrate in the prior art.

Reference signs: 1. odd number data line group; 2. even number data line group; 3. connecting piece; 4. data line metal layer; 5. photoresist layer; 6. passivation layer; 7. first via; 8. second via; 9. composite layer; L1. first shorting bar; L2. second shorting bar; S. disconnection area.

DETAILED DESCRIPTION OF THE EMBODIMENTS

The specific embodiments of the present invention will be illustrated below in detail in combination with the accompanying drawings. It should be understood that, the specific embodiments described herein are merely used for illustrating and explaining the present invention, rather than limiting the present invention.

As one aspect of the present invention, a method for manufacturing an array substrate is provided. The array substrate includes a plurality of data line groups and a plurality of shorting bars each correspondingly connected with one of the plurality of data line groups. The method for manufacturing the array substrate includes the following steps:

forming a pattern including a source-drain component, the plurality of data line groups and a first shorting bar, wherein each data line in the plurality of data line groups forms an integral structure with the first shorting bar;

etching the source-drain component to form a source electrode and a drain electrode;

disconnecting the data line groups which do not correspond to the first shorting bar from the first shorting bar;

forming other shorting bars among the plurality of shorting bars other than the first shorting bar; and connecting the data line groups which do not correspond to the first shorting bar with the other shorting bars corresponding thereto respectively through connecting pieces.

It needs to be noted that, in the above steps, the step of disconnecting the data line groups which do not correspond to the first shorting bar from the first shorting bar is not prior to the step of etching the source-drain component.

In general, a plurality of thin film transistors and a plurality of data lines are formed in a display area of the array substrate. A plurality of shorting bars can be formed in a non-display area in order to test the data lines, and correspondingly, the data lines are divided into multiple groups. The "corresponding" mentioned above refers to that, in the test, each data line group is correspondingly connected with a shorting bar, and each shorting bar provides a test signal for the corresponding data line group. For example, two shorting bars can be formed, and the two shorting bars are respectively connected with odd number data lines with odd arrangement sequence numbers and even number data lines with even arrangement sequence numbers; or three shorting bars are formed, and the three shorting bars are respectively connected with data lines of red pixel units, data lines of green pixel units and data lines of blue pixel units.

In a process of manufacturing the array substrate by using a 4-Mask process, the data lines, the shorting bars, the source electrode and the drain electrode can be formed by one patterning process, wherein the data lines and the source-drain component (namely, integrated source electrode and drain electrode) are formed by a first etching, and the source-drain component is broken at the middle portion to form the separate source electrode and drain electrode by photoresist ashing and a second etching. In the present invention, each data line in the plurality of data line groups forms the integral structure with the first shorting bar, therefore when too many static charges are accumulated on a certain data line, charges are released onto the other data lines through the shorting bar so as to reduce the electrostatic breakdown phenomenon. After the data lines in some of data line groups are disconnected from the first shorting bar, the disconnected data lines are connected with the corresponding shorting bars through the connecting pieces. Therefore, in the method provided by the present invention, before forming the source electrode and the drain electrode, each data line in the data line groups is always intercommunicated, thus electrostatic charges generated in the technological process (for example, ashing process) of forming the source electrode and the drain electrode can be transferred among a plurality of data lines to reduce the electrostatic breakdown phenomenon, so as to improve the product quality.

The step of disconnecting the data line groups which do not correspond to the first shorting bar from the first shorting bar can be carried out after forming the source electrode and the drain electrode, so as to reduce the electrostatic breakdown phenomenon as far as possible.

The position relationship of the plurality of shorting bars is not specifically limited in the present invention. The plurality of shorting bars can be arranged on the same layer as the data lines (namely located on a data line metal layer 4), or some of the shorting bars are arranged on the same layer as the data lines, while the other shorting bars are arranged on the same layer as a gate electrode.

In a first embodiment of the present invention, the step of forming the other shorting bars among the plurality of shorting bars and the step of forming the pattern including the source-drain component, the plurality of data line groups and the first shorting bar are carried out at the same time. Namely, all the shorting bars are made of the same material as a metal material (referred as "data line metal") forming the data lines.

Figure 2:
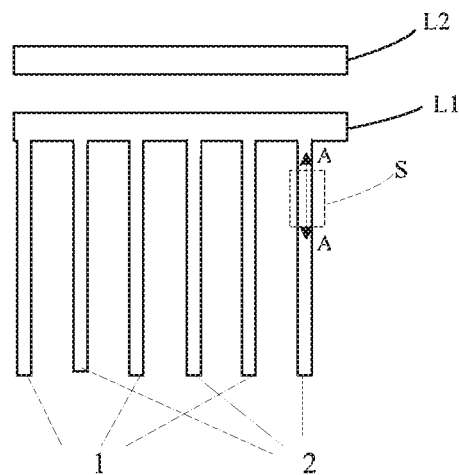
FIG. 2 is a top view used for illustrating a step of forming a plurality of data lines and shorting bars in a first embodiment of the present invention.

When the plurality of shorting bars are located on the data line metal layer 4, in order to facilitate the process and reduce the overlapping of the signal lines, the shorting bars other than the first shorting bar among the plurality of shorting bars are located at positions farther away from the display area of the array substrate than the position of the first shorting bar. As shown in FIG. 2, the first shorting bar L1, the second shorting bar L2, an odd number data line group 1 and an even number data line group 2 are formed at the same time, and the odd number data line group 1, the even number data line group 2 and the first shorting bar L1 are formed into an entirety.

In a second embodiment of the present invention, the plurality of shorting bars can be arranged in different layers, and the method further includes: forming a pattern including the gate electrode and a gate line (the gate electrode and the gate line are not shown in the figure). The step is carried out at the same time as the step of forming the other shorting bars among the plurality of shorting bars.

Figure 6:
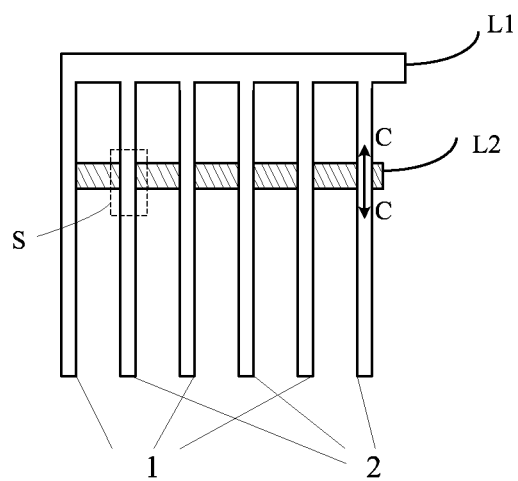
FIG. 6 is a top view used for illustrating a step of forming a plurality of data lines and shorting bars in a second embodiment of the present invention.
Figure 10:
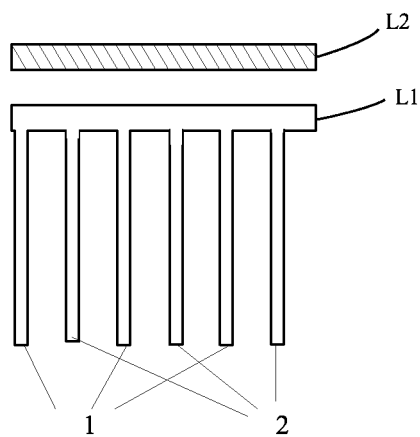
FIG. 10 is a top view used for illustrating a step of forming a plurality of data lines and shorting bars in a preferred embodiment of the present invention.
Figure 11:
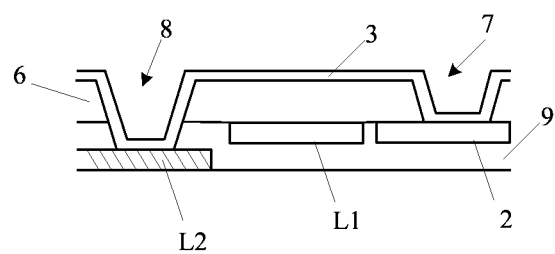
FIG. 11 is a schematic diagram used for illustrating a step of forming a first via, a second via and a connecting piece in the preferred embodiment of the present invention.

In the second embodiment of the present invention, the position relationship of the shorting bars formed at the same time as the gate electrode and the gate line and the first shorting bar formed at the same time as the data lines is not limited. When the first shorting bar and the second shorting bar are arranged on the array substrate, as shown in FIG. 6, the shorting bars (namely the second shorting bar L2) other than the first shorting bar L1 among the plurality of shorting bars can be arranged at positions closer to the display area than the position of the first shorting bar L1; or as shown in FIG. 10, the shorting bars (namely the second shorting bar L2) other than the first shorting bar among the plurality of shorting bars can be arranged at positions farther away from the display area than the position of the first shorting bar L1. It needs to be noted herein that, the difference of FIG. 10 and FIG. 2 lies in that, the second shorting bar L2 in FIG. 10 is made of the same material as a metal material (referred as "gate metal") forming the gate electrode, and the second shorting bar L2 in FIG. 2 is made of the data line metal. In the accompanying drawings, the second shorting bar L2 marked with oblique lines refers to the second shorting bar L2 arranged on the same layer as the gate electrode; the second shorting bar L2 marked with no oblique line refers to the second shorting bar L2 arranged on the same layer as the data lines.

According to a preferred embodiment of the present invention, as shown in FIG. 10, the first shorting bar L1 is arranged on the same layer as the data lines, the shorting bars (namely the second shorting bar L2) other than the first shorting bar L1 are arranged on the same layer as the gate electrode and the gate line. The shorting bars other than the first shorting bar L1 among the plurality of shorting bars are located at positions farther away from the display area of the array substrate than the position of the first shorting bar. Due to this arrangement manner, the data lines in the odd number data line group 1 connected with the first shorting bar L1 can be prevented from being overlapped with the second shorting bar L2 made of the gate electrode metal, so as to reduce electrostatic breakdown.

After disconnecting the data line groups which do not correspond to the first shorting bar L1 from the first shorting bar, the data line groups which do not correspond to the first shorting bar L1 are connected with the other shorting bars corresponding thereto respectively through the connecting pieces 3. Namely, after disconnected the even number data line group 2 from the first shorting bar L1, the even number data line group 2 is connected with the second shorting bar L2 through the connecting pieces 3. Specifically, the step further includes:

forming a passivation layer 6;

forming multiple groups of vias on the passivation layer 6, wherein each group of vias includes a first via 7 and a second via 8, the first via 7 is used for exposing one of the data lines in the data line groups which do not correspond to the first shorting bar L1, and the second via 8 is used for exposing the other shorting bar corresponding to the data line exposed by the first via 7 of the same group; and forming a pattern including a plurality of connecting pieces 3 on the passivation layer 6, wherein each connecting piece 3 is used for connecting the data line in the data line groups which do not correspond to the first shorting bar L1 with the respective corresponding shorting bar through a group of vias.

Specifically, as shown in FIGS. 4, 5, 8, 9 and 11, the odd number data line group 1 corresponds to the first shorting bar L1, and the even number data line group 2 corresponds to the second shorting bar L2. After disconnected each data line in the even number data line group 2 from the first shorting bar L1, the passivation layer is formed, and multiple groups of vias are formed on the passivation layer. Each group of vias includes the first via 7 and the second via 8. Each first via 7 corresponds to one data line in the even number data line group 2, and each second via 8 exposes a part of the second shorting bar. Each connecting piece 3 is connected between a pair of first via 7 and second via 8 of one group, so as to connect each data line in the even number data line group 2 with the second shorting bar L2.

The method for manufacturing the array substrate further includes: forming a transparent electrode; wherein the step of forming the pattern including the plurality of connecting pieces 3 on the passivation layer and the step of forming the transparent electrode are carried out at the same time, and the connecting pieces 3 and the transparent electrode can be formed by one photoetching patterning process so as to simplify the manufacturing process.

In the present invention, for the convenient operation of the process, the step of etching the source-drain component to form the source electrode and the drain electrode and the step of disconnecting the data line groups which do not correspond to the first shorting bar from the first shorting bar can be carried out at the same time.

Figure 3:
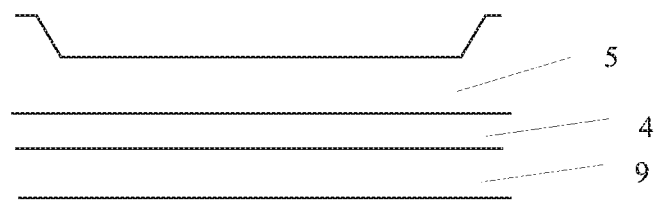
FIG. 3 is a section view taken along an A-A line in FIG. 2.
Figure 4:
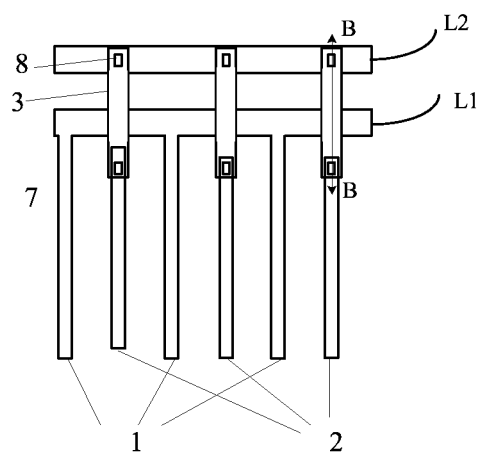
FIG. 4 is a top view used for illustrating a step of forming a first via, a second via and a connecting piece in the first embodiment of the present invention.
Figure 5:
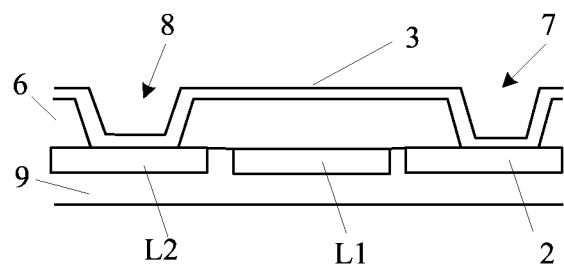
FIG. 5 is a section view taken along a B-B line in FIG. 4.
Figure 7:
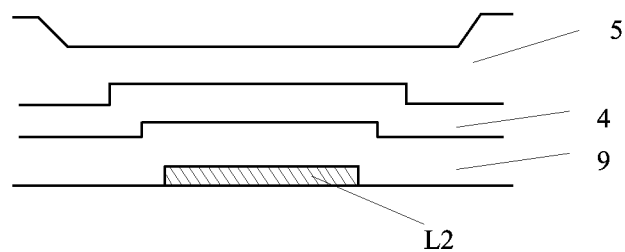
FIG. 7 is a section view taken along a C-C line in FIG. 6.
Figure 8:
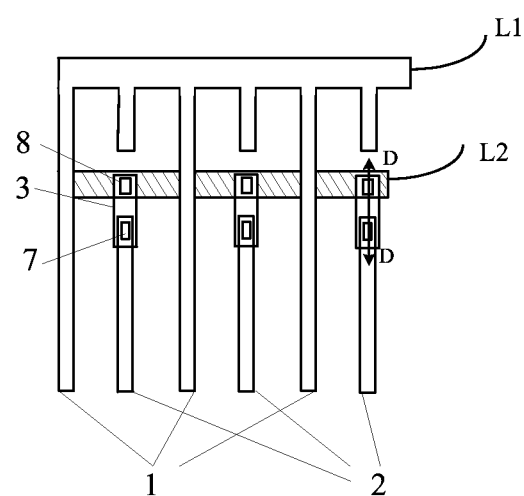
FIG. 8 is a top view used for illustrating a step of forming a first via, a second via and a connecting piece in the second embodiment of the present invention.
Figure 9:
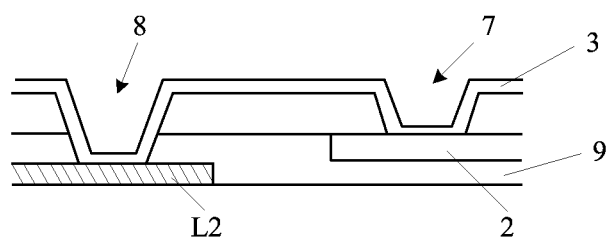
FIG. 9 is a section view taken along a D-D line in FIG. 8.

Specifically, the step of forming the pattern including the source-drain component, the plurality of data line groups and the first shorting bar further includes:
forming the data line metal layer 4;
forming a photoresist layer 5 on the data line metal layer 4;
as shown in FIGS. 3 and 7, exposing and developing the photoresist layer 5 by using a halftone mask plate to form an intermediate pattern on the photoresist layer, wherein the intermediate pattern includes full-exposed photoresist, semi-exposed photoresist and unexposed photoresist, which respectively correspond to a transparent region, a semitransparent region and a non-transparent redion of the halftone mask plate, the transparent region corresponds to the data line groups, the source-drain component and the first shorting bar, the semitransparent region corresponds to disconnection areas of the data line groups which do not correspond to the first shorting bar, and the non-transparent region corresponds to a part to be etched off on the data line metal layer 4; and
etching on the data line metal layer 4 with the intermediate pattern as a mask to form the pattern including the source-drain component, the plurality of data line groups and the first shorting bar.

Meanwhile, the steps of etching the source-drain component and disconnecting the data line groups which do not correspond to the first shorting bar from the first shorting bar, which are carried out at the same time, further include:
ashing the intermediate pattern to remove the semi-exposed photoresist; and
re-etching the data line metal layer 4 with the ashed intermediate pattern as a mask to form the source electrode and the drain electrode, and disconnecting the data line groups which do not correspond to the first shorting bar from the first shorting bar.

In the above step, the non-transparent region of the halftone mask plate corresponds to the unexposed photoresist, the semitransparent region corresponds to the semi-exposed photoresist, and the thickness of the semi-exposed photoresist is smaller than the thickness of the unexposed photoresist. When disconnecting the data line groups which do not correspond to the first shorting bar from the first shorting bar, the disconnection area can be located on the data lines and be close to the shorting bars as much as possible. Dotted boxes S in FIGS. 2 and 6 indicate the disconnection area. The disconnection area and the middle part of the source-drain component correspond to the semi-exposed photoresist. After ashing, the semi-exposed photoresist is removed, at this time, the disconnection area and the middle part of the source-drain component are exposed, thus the data line metal in the disconnection area and the middle part of the source-drain component can be etched off by a second etching, so as to disconnect of the data line groups which do not correspond to the first shorting bar from the first shorting bar and form the mutually separated source electrode and drain electrode.

It needs to be noted that, in the above description of the embodiments of the present invention in combination with the accompanying drawings, the data lines are divided into the odd number data line group and the even number data line group, and the plurality of shorting bars include the first shorting bar and the second shorting bar. However, the present invention is not limited hereto, but the data lines and the shorting bars can be classified according to other manners, therefore the number of the shorting bars is not limited to two. For example, the data lines can be divided into red pixel data lines, blue pixel data lines and green pixel data lines, and the shorting bars can include a first shorting bar for providing signals to the red pixel data lines, a second shorting bar for providing signals to the blue pixel data lines and a third shorting bar for providing signals to the green pixel data lines. Under this condition, as long as the first shorting bar L1 and the plurality of data lines are arranged on the same layer, the positions of the other shorting bars are not limited.

It can be understood that, the array substrate generally further includes a gate insulating layer and an active layer, which are arranged above the gate electrode and the gate line, and as shown in FIGS. 3, 5, 7, 9 and 11, the gate insulating layer and the active layer are collectively marked as a composite layer 9.

The method for manufacturing the array substrate provided by the present invention has been described above, it can be seen that, in the plurality of shorting bars formed in the present invention, the first shorting bar and the plurality of data lines are formed into an entirety. At the time of or after forming the source electrode and the drain electrode, the data line groups which do not correspond to the first shorting bar are disconnected from the first shorting bar, and the disconnected data lines are connected with their corresponding shorting bars through the connecting pieces. Therefore, during manufacturing the array substrate, the data lines are kept to be connected with at least one shorting bar, so that the static charges on a certain data line can be dispersed onto other data lines to reduce the electrostatic breakdown phenomenon.

It can be understood that, the foregoing embodiments are merely exemplary embodiments used for illustrating the principle of the present invention, but the present invention is not limited hereto. Those of ordinary skill in the art can make various variations and improvements without departing from the spirit and essence of the present invention, and these variations and improvements shall fall within the protection scope of the present invention.

The invention claimed is:
1. A method for manufacturing an array substrate comprising a plurality of data line groups and a plurality of shorting bars each correspondingly connected with one of the plurality of data line groups, wherein the method for manufacturing the array substrate comprises:
forming a pattern comprising a source-drain component, the plurality of data line groups and a first shorting bar, wherein each data line in the plurality of data line groups forms an integral structure with the first shorting bar;

etching the source-drain component to form a source electrode and a drain electrode;

disconnecting the data line groups which do not correspond to the first shorting bar from the first shorting bar;

forming other shorting bars among the plurality of shorting bars other than the first shorting bar; and connecting the data line groups which do not correspond to the first shorting bar with the other shorting bars corresponding thereto respectively through connecting pieces, wherein the step of disconnecting the data line groups which do not correspond to the first shorting bar from the first shorting bar is not prior to the step of etching the source-drain component.

2. The method for manufacturing the array substrate of claim 1, wherein the step of forming the other shorting bars among the plurality of shorting bars other than the first shorting bar and the step of forming the pattern comprising the source-drain component, the plurality of data line groups and the first shorting bar are carried out at the same time.

3. The method for manufacturing the array substrate of claim 2, wherein the other shorting bars among the plurality of shorting bars other than the first shorting bar are located at positions farther away from a display area of the array substrate than the position of the first shorting bar.

4. The method for manufacturing the array substrate of claim 1, further comprising: forming a pattern comprising a gate electrode and a gate line, wherein the step of forming the pattern comprising the gate electrode and the gate line and the step of forming the other shorting bars among the plurality of shorting bars other than the first shorting bar are carried out at the same time.

5. The method for manufacturing the array substrate of claim 4, wherein the other shorting bars among the plurality of shorting bars other than the first shorting bar are located at positions farther away from the display area of the array substrate than the position of the first shorting bar.

6. The method for manufacturing the array substrate of claim 1, wherein the step of connecting the data line groups which do not correspond to the first shorting bar with the other shorting bars corresponding thereto respectively through the connecting pieces comprises:

forming a passivation layer;

forming multiple groups of vias on the passivation layer, wherein each group of vias comprises a first via and a second via, the first via is used for exposing one of the data lines in the data line groups which do not correspond to the first shorting bar, and the second via is used for exposing the other shorting bar corresponding to the data line exposed by the first via of the same group; and forming a pattern comprising a plurality of connecting pieces on the passivation layer, wherein each connecting piece is used for connecting the data line in the data line groups which do not correspond to the first shorting bar with the respective corresponding shorting bar through a group of vias.

7. The method for manufacturing the array substrate of claim 2, wherein the step of connecting the data line groups which do not correspond to the first shorting bar with the other shorting bars corresponding thereto respectively through the connecting pieces comprises:

forming a passivation layer;

forming multiple groups of vias on the passivation layer, wherein each group of vias comprises a first via and a second via, the first via is used for exposing one of the data lines in the data line groups which do not correspond to the first shorting bar, and the second via is used for exposing the other shorting bar corresponding to the data line exposed by the first via of the same group; and forming a pattern comprising a plurality of connecting pieces on the passivation layer, wherein each connecting piece is used for connecting the data line in the data line groups which do not correspond to the first shorting bar with the respective corresponding shorting bar through a group of vias.

8. The method for manufacturing the array substrate of claim 3, wherein the step of connecting the data line groups which do not correspond to the first shorting bar with the other shorting bars corresponding thereto respectively through the connecting pieces comprises:

forming a passivation layer;

forming multiple groups of vias on the passivation layer, wherein each group of vias comprises a first via and a second via, the first via is used for exposing one of the data lines in the data line groups which do not correspond to the first shorting bar, and the second via is used for exposing the other shorting bar corresponding to the data line exposed by the first via of the same group; and forming a pattern comprising a plurality of connecting pieces on the passivation layer, wherein each connecting piece is used for connecting the data line in the data line groups which do not correspond to the first shorting bar with the respective corresponding shorting bar through a group of vias.

9. The method for manufacturing the array substrate of claim 4, wherein the step of connecting the data line groups which do not correspond to the first shorting bar with the other shorting bars corresponding thereto respectively through the connecting pieces comprises:

forming a passivation layer;

forming multiple groups of vias on the passivation layer, wherein each group of vias comprises a first via and a second via, the first via is used for exposing one of the data lines in the data line groups which do not correspond to the first shorting bar, and the second via is used for exposing the other shorting bar corresponding to the data line exposed by the first via of the same group; and forming a pattern comprising a plurality of connecting pieces on the passivation layer, wherein each connecting piece is used for connecting the data line in the data line groups which do not correspond to the first shorting bar with the respective corresponding shorting bar through a group of vias.

10. The method for manufacturing the array substrate of claim 5, wherein the step of connecting the data line groups which do not correspond to the first shorting bar with the other shorting bars corresponding thereto respectively through the connecting pieces comprises:

forming a passivation layer;

forming multiple groups of vias on the passivation layer, wherein each group of vias comprises a first via and a second via, the first via is used for exposing one of the data lines in the data line groups which do not correspond to the first shorting bar, and the second via is used for exposing the other shorting bar corresponding to the data line exposed by the first via of the same group; and forming a pattern comprising a plurality of connecting pieces on the passivation layer, wherein each connecting piece is used for connecting the data line in the data line groups which do not correspond to the first shorting bar with the respective corresponding shorting bar through a group of vias.

11. The method for manufacturing the array substrate of claim 6, further comprising: forming a transparent electrode, wherein the step of forming the pattern comprising the plurality of connecting pieces on the passivation layer and the step of forming the transparent electrode are carried out at the same time.

12. The method for manufacturing the array substrate of claim 7, further comprising: forming a transparent electrode, wherein the step of forming the pattern comprising the plurality of connecting pieces on the passivation layer and the step of forming the transparent electrode are carried out at the same time.

13. The method for manufacturing the array substrate of claim 1, wherein the step of etching the source-drain component and the step of disconnecting the data line groups which do not correspond to the first shorting bar from the first shorting bar are carried out at the same time.

14. The method for manufacturing the array substrate of claim 2, wherein the step of etching the source-drain component and the step of disconnecting the data line groups which do not correspond to the first shorting bar from the first shorting bar are carried out at the same time.

15. The method for manufacturing the array substrate of claim 3, wherein the step of etching the source-drain component and the step of disconnecting the data line groups which do not correspond to the first shorting bar from the first shorting bar are carried out at the same time.

16. The method for manufacturing the array substrate of claim 4, wherein the step of etching the source-drain component and the step of disconnecting the data line groups which do not correspond to the first shorting bar from the first shorting bar are carried out at the same time.

17. The method for manufacturing the array substrate of claim 5, wherein the step of etching the source-drain component and the step of disconnecting the data line groups which do not correspond to the first shorting bar from the first shorting bar are carried out at the same time.

18. The method for manufacturing the array substrate of claim 13, wherein the step of forming the pattern comprising the source-drain component, the plurality of data line groups and the first shorting bar comprises:

forming a data line metal layer;

forming a photoresist layer on the data line metal layer;

exposing and developing the photoresist layer by using a halftone mask plate to form an intermediate pattern on the photoresist layer, wherein the intermediate pattern comprises full-exposed photoresist, semi-exposed photoresist and unexposed photoresist, which respectively correspond to a transparent region, a semitransparent region and a non-transparent region of the halftone mask plate, the transparent region corresponds to the data line groups, the source-drain component and the first shorting bar, the semitransparent region corresponds to disconnection areas of the data line groups which do not correspond to the first shorting bar, and the non-transparent region corresponds to a part to be etched off on the data line metal layer; and etching the data line metal layer with the intermediate pattern as a mask to form the pattern comprising the source-drain component, the plurality of data line groups and the first shorting bar, wherein, the steps of etching the source-drain component and disconnecting the data line groups which do not correspond to the first shorting bar from the first shorting bar, which are carried out at the same time, further comprise:

ashing the intermediate pattern to remove the semi-exposed photoresist; and re-etching the data line metal layer with the ashed intermediate pattern as a mask to form the source electrode and the drain electrode, and disconnecting the data line groups which do not correspond to the first shorting bar from the first shorting bar.

19. The method for manufacturing the array substrate of claim 14, wherein the step of forming the pattern comprising the source-drain component, the plurality of data line groups and the first shorting bar comprises:

forming a data line metal layer;

forming a photoresist layer on the data line metal layer;

exposing and developing the photoresist layer by using a halftone mask plate to form an intermediate pattern on the photoresist layer, wherein the intermediate pattern comprises full-exposed photoresist, semi-exposed photoresist and unexposed photoresist, which respectively correspond to a transparent area, a semitransparent region and a non-transparent region of the halftone mask plate, the transparent region corresponds to the data line groups, the source-drain component and the first shorting bar, the semitransparent region corresponds to disconnection areas of the data line groups which do not correspond to the first shorting bar, and the non-transparent region corresponds to a part to be etched off on the data line metal layer; and etching the data line metal layer with the intermediate pattern as a mask to form the pattern comprising the source-drain component, the plurality of data line groups and the first shorting bar, wherein, the steps of etching the source-drain component and disconnecting the data line groups which do not correspond to the first shorting bar from the first shorting bar, which are carried out at the same time, further comprises:

ashing the intermediate pattern to remove the semi-exposed photoresist; and re-etching the data line metal layer with the ashed intermediate pattern as a mask to form the source electrode and the drain electrode, and disconnecting the data line groups which do not correspond to the first shorting bar from the first shorting bar.

20. The method for manufacturing the array substrate of claim 16, wherein the step of forming the pattern comprising the source-drain component, the plurality of data line groups and the first shorting bar comprises:

forming a data line metal layer;

forming a photoresist layer on the data line metal layer;

exposing and developing the photoresist layer by using a halftone mask plate to form an intermediate pattern on the photoresist layer, wherein the intermediate pattern comprises full-exposed photoresist, semi-exposed photoresist and unexposed photoresist, which respectively correspond to a transparent region, a semitransparent region and a non-transparent region of the halftone mask plate, the transparent region corresponds to the data line groups, the source-drain component and the first shorting bar, the semitransparent region corresponds to disconnection areas of the data line groups which do not correspond to the first shorting bar, and the non-transparent region corresponds to a part to be etched off on the data line metal layer; and etching the data line metal layer with the intermediate pattern as a mask to form the pattern comprising the source-drain component, the plurality of data line groups and the first shorting bar, wherein, the steps of etching the source-drain component and disconnecting the data line groups which do not correspond to the first shorting bar from the first shorting bar, which are carried out at the same time, further comprises:

ashing the intermediate pattern to remove the semi-exposed photoresist; and re-etching the data line metal layer with the ashed intermediate pattern as a mask to form the source electrode and the drain electrode, and disconnecting the data line groups which do not correspond to the first shorting bar from the first shorting bar.

* * * * *